US007417574B2

(12) United States Patent
Tadeparthy et al.

(10) Patent No.: US 7,417,574 B2
(45) Date of Patent: Aug. 26, 2008

(54) EFFICIENT AMPLIFIER SHARING IN A MULTI-STAGE ANALOG TO DIGITAL CONVERTER

(75) Inventors: Preetam Charan Anand Tadeparthy, Bangalore (IN); Jomy G. Joy, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/162,982

(22) Filed: Sep. 30, 2005

(65) Prior Publication Data

US 2006/0125674 A1    Jun. 15, 2006

Related U.S. Application Data

(60) Provisional application No. 60/635,648, filed on Dec. 13, 2004.

(51) Int. Cl.
*H03M 1/12* (2006.01)
(52) U.S. Cl. ........................... 341/155; 341/118
(58) Field of Classification Search ................ 341/155, 341/161, 136, 172, 118
See application file for complete search history.

(56) References Cited

U.S. PATENT DOCUMENTS

| | | | | | |
|---|---|---|---|---|---|
| 5,355,135 | A | * | 10/1994 | Redfern | 341/156 |
| 5,739,726 | A | * | 4/1998 | Ling | 331/57 |
| 6,195,029 | B1 | * | 2/2001 | Urry et al. | 341/138 |
| 6,215,427 | B1 | * | 4/2001 | Bonhoure et al. | 341/118 |
| 6,359,579 | B1 | * | 3/2002 | Chiang | 341/155 |
| 6,707,333 | B2 | * | 3/2004 | Matsumoto et al. | 327/534 |
| 6,847,234 | B2 | * | 1/2005 | Choi | 327/65 |
| 6,870,495 | B1 | * | 3/2005 | Zadeh et al. | 341/161 |
| 6,977,534 | B2 | * | 12/2005 | Radelinow | 327/112 |
| 2001/0007443 | A1 | * | 7/2001 | Ono | 341/159 |
| 2004/0041593 | A1 | * | 3/2004 | Lai | 326/115 |

\* cited by examiner

*Primary Examiner*—Jean Bruner Jeanclaude
*Assistant Examiner*—Joseph Lauture
(74) *Attorney, Agent, or Firm*—William B. Kempler; W. James Brady, III; Frederick J. Telecky, Jr.

(57) ABSTRACT

An analog to digital converter (ADC) containing an operational amplifier having a first pair of input terminals and a second pair of input terminals, wherein the output varies if the input signals on either of the input terminals pairs is changed in either the sampling phase or a hold phase. Such an operational amplifier is conveniently shared by two stages of a ADC, while reducing power consumption as well as errors.

16 Claims, 4 Drawing Sheets

EFFICIENT AMPLIFIER SHARING IN A MULTI-STAGE ANALOG TO DIGITAL CONVERTER

RELATED APPLICATIONS

The present application is related to the now abandoned U.S. Provisional Patent Application Ser. No. 60/635,648, entitled, "Novel Amplifier Sharing Scheme for Pipeline Analog to Digital Converter", filed on Dec. 13, 2004, naming as inventor: TADEPARTHY et al, the benefit of which is hereby claimed, and which is incorporated in its entirety herewith.

BACKGROUND

1. Field of the Invention

The present invention relates generally to the design of analog to digital converters (ADC) and more specifically to method and apparatus providing efficient amplifier sharing in a multi-stage ADC.

2. Related Art

An analog to digital converter (ADC) is generally used to sample an analog signal at various time instances, and generate digital codes representing the strength of the sampled analog signal at the corresponding time instances. Typically, high resolution (representing each digital code in a large number of digital bits) ADCs are implemented using multiple stages. A pipelined ADC is a type of ADC which contains multiple stages, with each stage resolving a number of bits forming a sub-code. The sub-codes generated by various stages are used to generate a digital code corresponding to the sampled analog signal.

Each stage of an ADC generally needs an amplifier to amplify a residue signal representing a difference of the voltage level of the input signal and the voltage equivalent of the generated sub-code. For example assuming a stage generates a sub-code equaling S, the residue signal equals (Vin−(S*Vref/$2^P$)) wherein p represents the number of bits in the sub-code S, Vref represents a reference voltage and Vin represents sampled input signal.

The amplifier amplifies the residue signal generally with a gain of 2P to an appropriate voltage levels. The amplified residue signal is provided as an input signal to the next stage. According to one prior approach, each stage is provided with a separate amplifier to provide the desired amplification for the stage. In the corresponding embodiments, the amplifier may not be utilized in some time durations (e.g., in sampling phase of the stage, as described with examples below), and the amplifier may continue to consume power in such un-utilized durations, as well. As a result, unacceptably large amount of power may be consumed by each of such stages.

In order to reduce the overall power consumption of the ADC an amplifier is shared between two stages in a time multiplexed manner. For example, in one prior embodiment, an amplifier is used to amplify the residue signal of one stage in a first time duration and the same amplifier is used to amplify the residue signal of the other stage in a second time duration. Due to the reduction of the un-utilized time duration compared to the prior embodiment described in the above paragraph(s), the aggregate power consumption due to the two stages is reduced. However, such amplifier sharing may introduce non-linearity leading to errors in the digital codes generated.

Hence, there is a general need to implement amplifier sharing with reduced non-linearity and power consumption in analog to digital converters.

BRIEF DESCRIPTION OF THE DRAWINGS

The present invention will be described with reference to the following accompanying drawings.

FIG. (FIG.) 1 is a block diagram illustrating the internal structure of example ADC in which several aspects of the present invention are implemented.

In the drawings, like reference numbers generally indicate identical, functionally similar, and/or structurally similar elements. The drawing in which an element first appears is indicated by the leftmost digit (s) in the corresponding reference number.

DETAILED DESCRIPTION

1. Overview

An operational amplifier provided according to an aspect of the present invention contains two pairs of input terminals, with a change in the input signal on either pair in either hold or sampling phase (of a stage of an ADC containing the operational amplifier) causes a corresponding change in the output signal of the operational amplifier.

Such a feature is conveniently used to share the operational amplifier by two stages of an ADC. One stage of the ADC uses the first pair of input terminals to amplify the corresponding residue signal and the second stage of the ADC uses the second pair of input terminals to amplify the corresponding residue signal. The two stages use the operational amplifier in non-overlapping durations. As a result, the ADC stages can be implemented with reduced power consumption as well as errors.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example ADC

Figure 1:
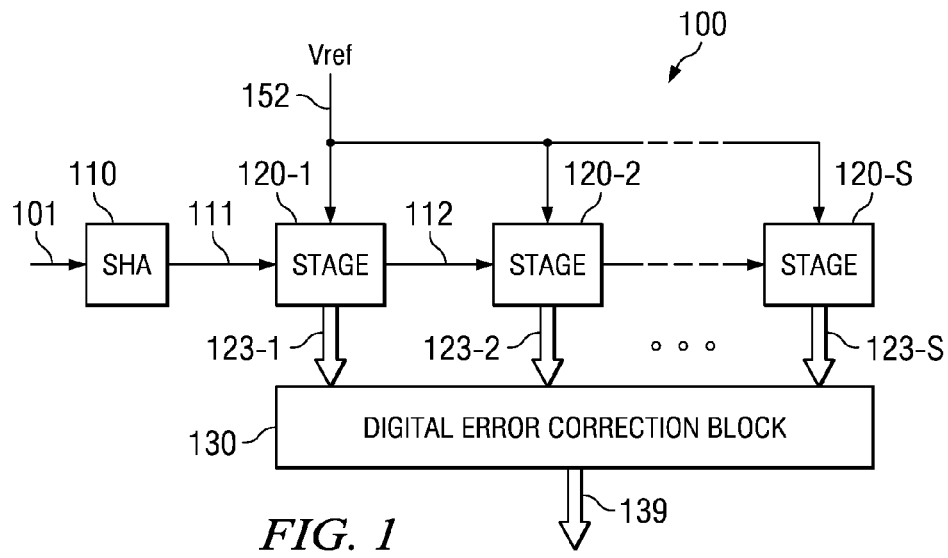

FIG. 1 is a block diagram of a pipe line ADC in which various aspect of present invention may be implemented.

ADC 100 is shown containing sample and hold amplifier (SHA) 110, stages 120-1 through 120-S and digital error correction block 130. Each block is described below in further detail.

SHA 110 samples the input analog signal received on path 101 and holds the voltage level of the sample on path 111 for further processing. Digital error correction block 130 receives sub-codes from various stages 120-1 through 120-S (on paths 123-1 through 123-S respectively), and generates a digital code corresponding to the sample received on path 101. Various error correction approaches, well known in the relevant arts, may be used to correct any errors in the received sub-codes. The generated digital code is provided on path 139 as a final digital code corresponding to the voltage of a sample on the input analog signal at a particular time instant.

Figure 2:
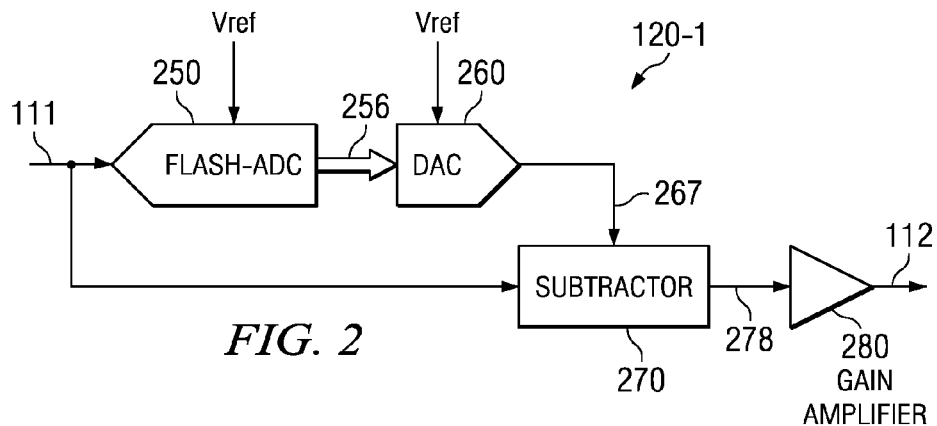
FIG. 2 is a block diagram illustrating the general operation of a stage of an ADC.

Each stage 120-1 through 120-S generates a sub-code (based on the reference signal Vref received on path 152) corresponding to a voltage level of an analog signal received as an input, and an amplified residue signal as an input to a (any) next stage. For example, stage 120-1 converts a voltage level on path 111 to generate a sub-code on path 123-1, and the amplified residue signal generated on path 112 is provided as an input to stage 120-2. A common reference signal Vref is generally provided to stages 120-1 through 120-S. FIG. 2 further illustrates (logical) components contained in each stage (described with reference to stage 120-1 only, for conciseness) of a pipe line ADC according to a known approach.

3. Stage of an ADC

With respect to FIG. 2, stage 120-1 is shown containing flash ADC 250, digital to analog converter (DAC) 260, subtractor 270 and gain amplifier 280. Flash ADC 250 (an example of a sub ADC) converts a sample of an analog signal received on path 111 into a corresponding p-bit sub-code provided on path 256 (contained in path 123-1 of FIG. 1, and P is less than N). DAC 260 generates the voltage equivalent of the sub-code received on path 256. The generated voltage (Vdac) is provided on path 267.

Subtractor 270 generates a residue signal as the difference of sample 111 (Vi) and the analog signal received on path 267. Gain amplifier 280 amplifies the residue signal (Vi-Vdac) and the amplified signal is provided on path 112 as an amplified residue signal. The signal on path 112 is used to resolve the remaining bits in the N-bit digital code by the subsequent stages of the ADC. The manner in which the residue signal is generated by each stage is described below with respect to FIGS. 3A and 3B.

Figure 3A:
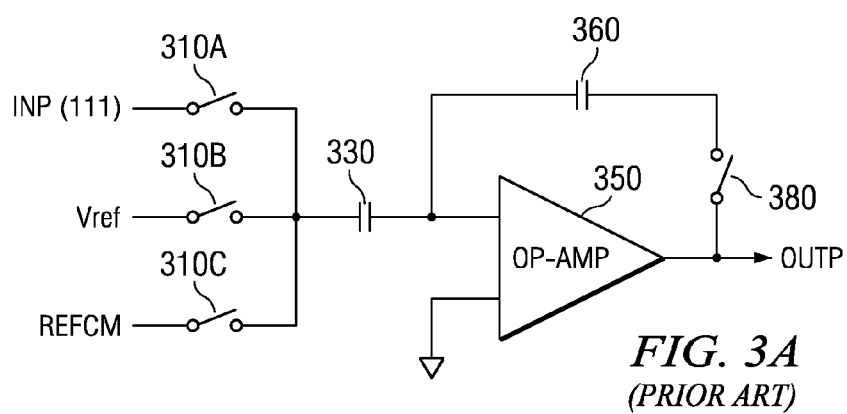
FIG. 3A is a circuit diagram of the implementation of a DAC, residue amplifier and a subtractor of a stage according to a prior approach.
Figure 3B:
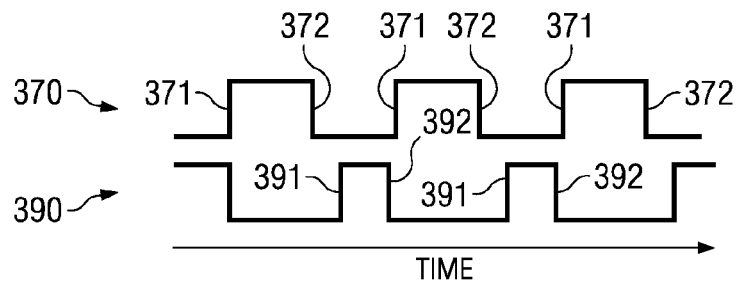
FIG. 3B is a timing diagram illustrating the sampling and hold phases of a stage of an ADC in one embodiment.

FIG. 3A is a circuit diagram illustrating the manner in which DAC 260, subtractor 270, and gain amplifier 280 are implemented in an embodiment providing p-bit sub-codes and FIG. 3B is a timing diagram used to illustrate the sample and hold phases of the circuit. The circuit diagram is shown containing switches 310A-310C, a unit sampling capacitor 330, op-amp 350, feedback capacitor 360, and feedback switch 380. It should be appreciated that only a single unit sampling capacitor and corresponding switches are shown in FIG. 3A for conciseness. However the circuit would contain $2^{\wedge}p$ such sets, wherein '^' represents the 'power of' mathematical operation. Each component is described below in further details.

The circuit of FIG. 3A operates using two phase signals, shown as sampling phase 370 and hold phase 390 in FIG. 3B. In the first phase (sampling phase 370) between time points 371 and 372, switch 310A is closed at time points 371 and the remaining switches 380, 310B, and 310C are kept open. As a result, sampling (input) capacitor 330 is ideally charged (in duration between 371-372) to the voltage of input sample received on path (INP) 111.

In the second phase (between time points 391-392), feedback switch 380 is closed and switch 310A is kept open. Connections of switches 310B and 310C are made such that the input terminals of sampling capacitor 330 is connected either to Vref or to REFCM terminal, as determined from the output of flash ADC 250 (sub-code S). As a result, capacitor 330 transfers a charge proportional to the difference (residue) of input signal and the Vref or REFCM to feedback capacitor 360 (up to time point 392). The residue is amplified by op-amp 350 and provided as amplified residue signal to the next stage (on path OUTP), as desired.

It may be appreciated that op-amp 350 is used for amplifying the residue signal only between time points 391 and 392 (corresponding to hold/amplifying phase of stage 120-1). However op-amp 350 is not utilized (remains idle) between time points 371 and 372 (corresponding to the sampling phase of stage 120-1), which may lead to unacceptably high power consumption.

To reduce the power consumption, as an improvement, op-amp 350 is used to amplify the residue signal of stage 120-2 between time point 371 and 372 (in addition to amplifying the residue signal of stage 120-1 between time points 391 and 392). In such an approach, the input and output terminal of op-amp 350 are respective connected to nodes 351 and 359 (formed by sampling capacitor 330 and feed back capacitor 380) of stage 120-1 between time point 391 and 392, as shown in FIG. 3A.

On the other hand, to support amplification requirements of stage 120-2, the input and output terminals are connected to corresponding nodes of stage 120-2 between time point 371 and 372 by use of appropriate switches.

One disadvantage with such an operation is, a charge (voltage) present (due to parasitic capacitance) on the input terminal of op-amp at time point 392 is carried to the amplification requirements of stage 120-2, causing a non-linearity (error) in the operation of the stage 120-2 ("memory effect" well known in the relevant art).

The charge/voltage present on the input terminal (in such a situation) is proportionate to Vo/A1, wherein Vo represents the voltage on output terminal OUTP at time point 392, and A1 represents the gain (ratio of the capacitance value of capacitor 330 and 360). Similarly, when the use of op-amp 350 is shifted for use with stage 120-1, an undesired charge (voltage) present on the input terminal at time point 372 is presented from stage 120-2 to stage 120-1.

Various techniques are used to reduce the memory effect problem while sharing the amplifier between two stages. One known prior embodiment is described below in detail.

4. Another Prior Amplifier Sharing Circuit

Figure 4:
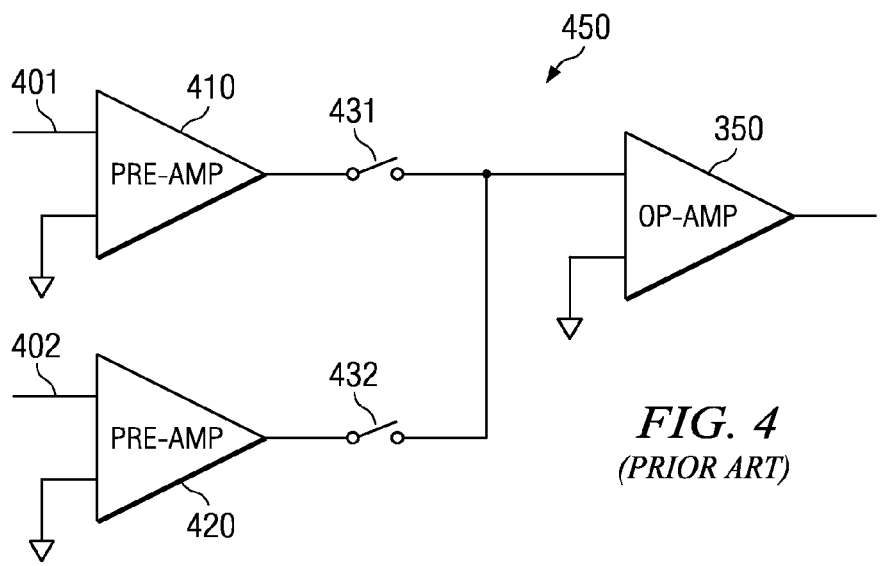
FIG. 4 is a circuit diagram illustrating the manner in which an operational amplifier is shared between two stages in a prior circuit.

FIG. 4 is a circuit diagram illustrating the manner in which an amplifier is shared between two stages in another prior circuit. The circuit diagram is shown containing pre-amplifiers 410 and 420, op-amp 350 and switches 431 and 432. Several components are not included in the circuit diagram to avoid obscuring the features sought to be described. The operation of each component is described below in further detail.

Switch 431 is closed and switch 432 is opened, when pre-amplifier 410 receives the residue signal of stage 120-1 (on path 401, from sampling capacitor 330 of FIG. 3A) between time points 391 and 392. A feedback capacitor (similar to 360 of FIG. 3A) would be connected between OUTP and 401. As a result, pre-amplifier 410 and op-amp 350 together operate to amplify the residue signal of stage 120-1 between time points 391 and 392.

Switch 432 is closed and switch 431 is opened, when pre-amplifier 420 receives the residue signal of stage 120-2

(on path 402) between time points 371 and 372. A feedback capacitor (similar to 360 of FIG. 3A) may also be connected between OUTP and 402 in this duration. As a result, pre-amplifier 420 and op-amp 350 together operate to amplify the residue signal of stage 120-1 between time points 371 and 372.

Due to the use of separate pre-amplifiers 410 and 420 for receiving the input from each stage 120-1 and 120-2 respectively, the input terminal (402) receiving residue signal in stage 120-2 is isolated from the output of the stage 120-1 (OUTP of op-amp 350 at time point 392). Similarly the output of stage 120-2 is isolated from the input terminal (401) receiving residue signal in stage 120-1, there by reducing the memory effect noted above.

Further op-amp 350 is used between time -points 291 and 292 as well between time points 371 and 372 respectively for amplifying the residue signal of stages 120-1 and 120-2. Due to such sharing the unneeded power consumption due to op-amp 350 is reduced.

However, pre-amplifiers 410 and 420 remain unutilized between time point 371-372 and 391-392 respectively, thereby consuming undesirable high power. Further switches 431 and 432 (and generally more switches, not shown) are additionally required to be operated from control signals, resulting in further consumption of a power and may cause a corresponding delay in signal propagation. Various aspects of the present invention provide for more efficient amplifier sharing in a multi-stage ADC, as described below in further detail.

5. Op-Amp with Four Inputs

Figure 5:
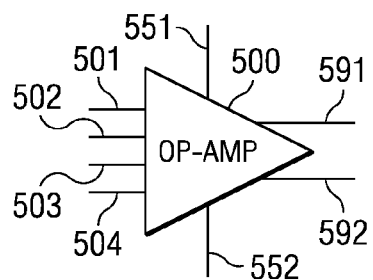
FIG. 5 is a block diagram illustrating the operation of an op-amp provided according to an aspect of the present invention.

FIG. 5 is a block diagram illustrating the details of an op-amp provided according to an aspect of the present invention. Op-amp 500 is shown containing 4 input terminals 501-504, two output terminals 591-592 and power supply terminals 551-552. Operation of op-amp 500 is described below in further detail.

Terminal 501 and 502 respectively represents a first pair of inverting and non-inverting terminals for receiving a first differential input signal. Terminals 503 and 504 respectively represents second pair of inverting and non-inverting terminals for receiving second differential input signal. Terminal 591 and 592 represents a pair of differential output terminals. Power supply terminals 551 and 552 respectively receive a positive and negative DC voltages used for biasing.

The output of op-amp 500 on terminals 591 and 592 is a function of input received on each of the terminals 501-504 in both sample (371-372) and hold phases (391-392), which may be represented as Vout=$V_{591}-V_{592}$=f($V_{501}$, $V_{502}$, $V_{503}$, $V_{504}$), wherein, V591 and V592 represent the voltage on terminal 591 and 592 respectively, $V_{501}$, $V_{502}$, $V_{503}$ and $V_{504}$ represents the voltage on input terminals 501-504.

In other words, a change of voltage level on any of the four terminals in either the sample phase or the hold phase causes a change in the voltage level on output terminals 591-592.

In contrast, the output of circuit 450 of FIG. 4 would not be affected by the variations in input 401 when switch 431 is open. Similarly, the output would also not be affected by the variations in input 402 when switch 432 is open. This property is a manifestation of the fact that pre-amplifiers 410 and 420 are not utilized completely in sample and hold durations (which leads to unneeded power consumption). The manner in which op-amp 500 of FIG. 5 can be used is described below in further detail.

6. ADC with Efficient Amplifier Sharing

Figure 6:
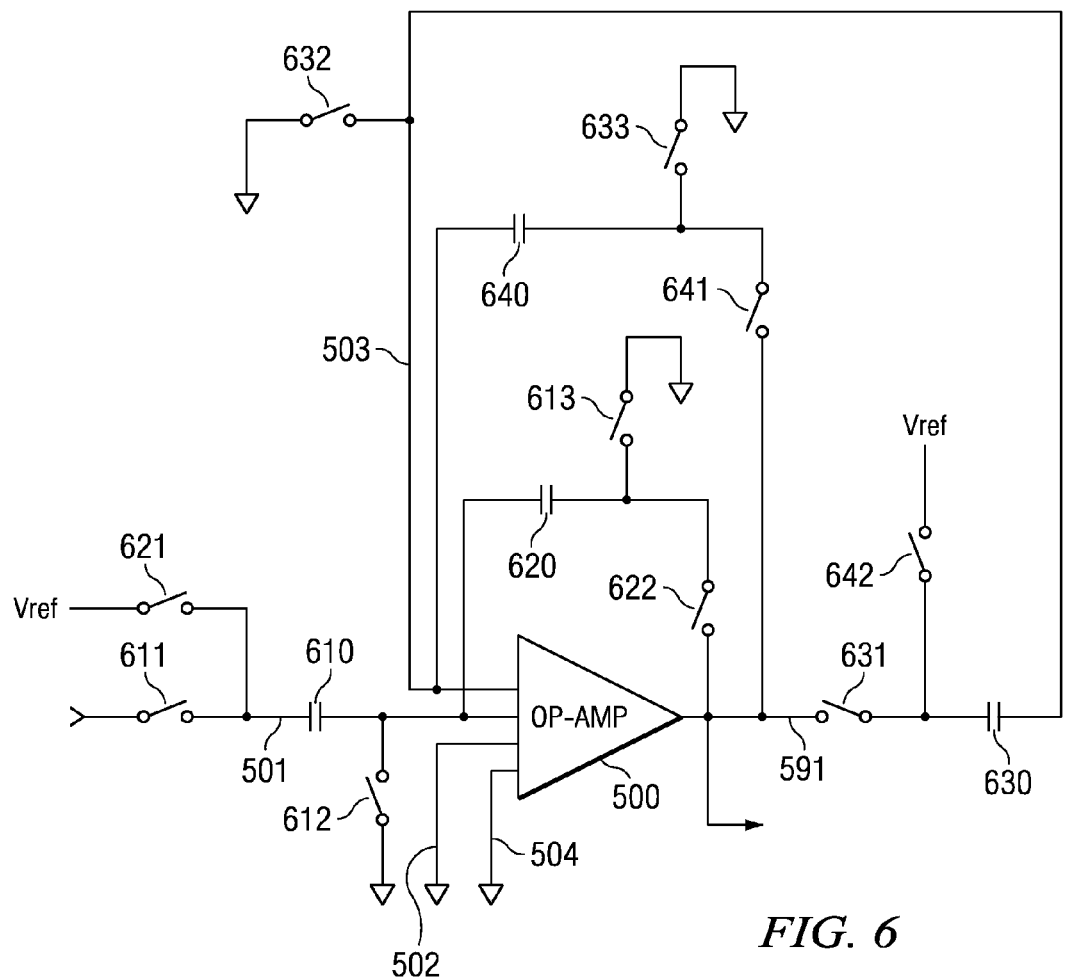
FIG. 6 is a block diagram illustrating the manner in which operational amplifier is shared between two stages of an operational amplifier in an embodiment of the present invention.

FIG. 6 is a circuit diagram illustrating the manner in which op-amp 500 can be shared by two stages of an ADC in an embodiment of the present invention. The circuit diagram is shown containing op-amp 500 along with capacitors 610, 620, 630 and 640, switches 611-613, 621-622, 631-633 and 641-642. The operation of the components in supporting the two stages, is described with reference to the timing diagram of FIG. 3B below.

In terms of connectivity, one terminal of each capacitor 610 and 620 is connected to terminal 501 (of first pair) and terminal 502 is grounded (constant bias) assuming a single ended application. Similarly, one terminal of each capacitor 630 and 640 is connected to terminal 503 (of second pair), and terminal 50 is grounded. On the other hand, in case of differential mode of operation, the terminals 502 and 504 are respectively connected (not shown) to similar circuits as those to which terminals 501 and 503 are connected. The manner in which different switches support the required operations in corresponding time durations, is described below.

Broadly, capacitors 610 and 620 respectively operate as a sampling capacitor and feedback capacitor of a first stage (120-1). Similarly, capacitors 630 and 640 respectively operate as a sampling capacitor and feedback capacitor of a second stage (120-2). The description is provided assuming that capacitor 610 is already charged (and thus, sampling is complete) by the previous stage prior to time point 372.

In hold duration (391-392), switches 611-613, 641 are opened and switches 621, 622 and 631-633 are closed. As a result, the voltage across capacitor 610 is amplified using the first pair of input pairs 501 and 502 and feedback capacitor 620, and the amplified signal is provided on terminal 591 (592 being the differential counter part of 591, and is not shown in FIG. 6).

In addition, any prior charges on capacitor 640 is discharged (and is ready for use in the second stage). Closing of switches 631 and 632 charges capacitor 630 to a voltage proportionate to the output of operational amplifier 500 by time point 392. Thus, at time point 392, the output path 591 represents the output of first stage (120-1).

In sample duration (371-372), switches 611-613, 641 and 642 are closed and switches 622 and 631-633 are opened. As a result, the voltage on capacitor 630 is amplified through the second pair of input terminals (503 and 504) using feedback capacitor 640 and the output is again available on termainal 591. Capacitor 610 samples the next input signal and the charge on capacitor 620 is discharged. The time between the end of 392 and 371 represents a non-overlap phase used to avoid shorting of output with undesirable nodes because of overlap edges in switched capacitor circuits. During this phase all the switches are open and the amplifier nodes are floating. However one can continues to use this time to reset the output and the inputs of the amplifier, so that the amplifier continues to be in a good operating region. Thus, at time point 372, the output on path 51 represents the output of the second stage (120-2).

Due to the use of separate input paths for the two stages (using the same operational amplifier), the non-linearity due to the residue charges may be eliminated. Since the unused circuit portions in operational amplifier 500 are substantially absent, unneeded power consumption is avoided (in comparison to FIG. 4, in which pre-amps 410 and 420 are not utilized in some durations, as described above).

The description is continued with respect to an example implementation of operational amplifier 500.

7. Implementation of Operational Amplifier

Figure 7:
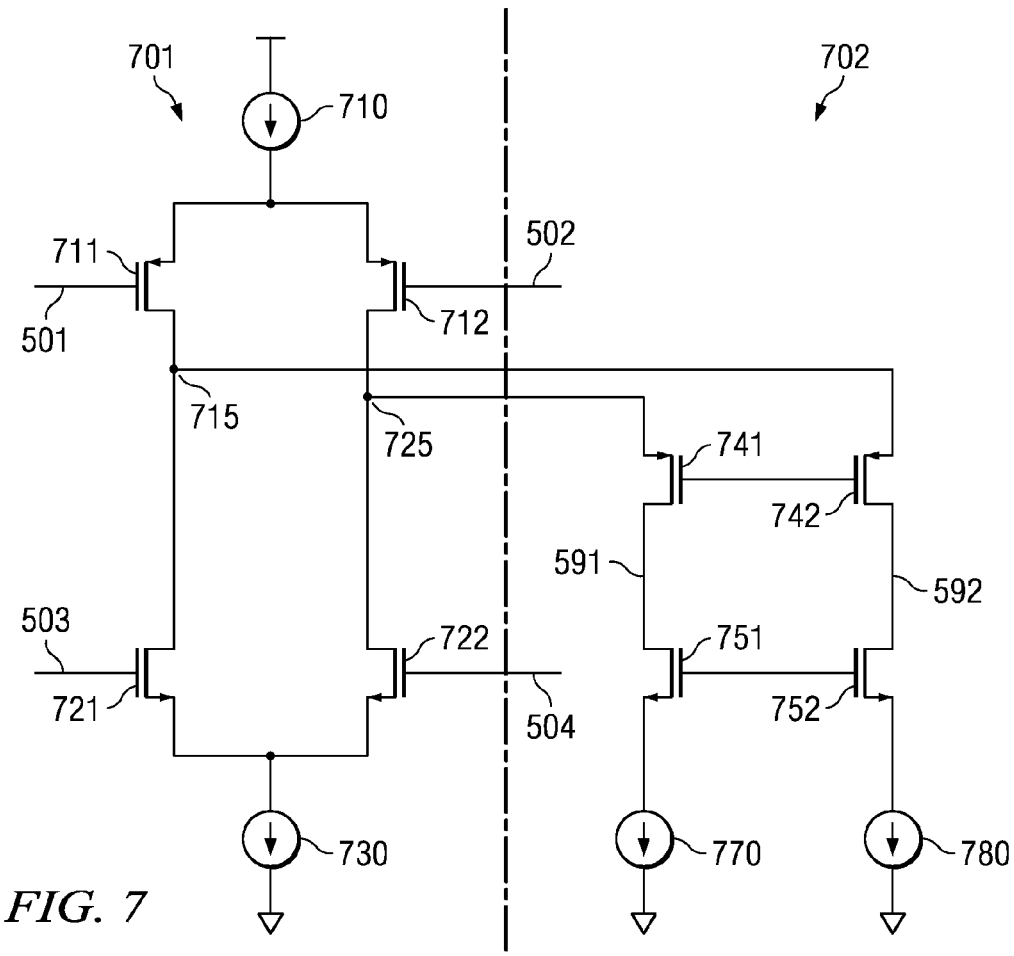
FIG. 7 is a circuit diagram illustrating the details of an operational amplifier in an embodiment of the present invention.

FIG. 7 is a circuit diagram illustrating the implementation of operational amplifier 500 in one embodiment. Operational amplifier 500 may be viewed as containing input stage 701 and sub-gain circuit 702. Input stage 701 is shown containing current sources 710 and 730, PMOS transistors 711 and 712, and NMOS transistors 721 and 722. Sub-gain circuit 702 is shown containing current sources 770 and 780, PMOS transistors 741 and 742, and NMOS transistors 751 and 752. The connectivity and operation of components are described below in further detail.

With respect to connectivity of input stage 701, the gate terminals of transistors 711 and 712 are used as the a pair of input terminals (501 and 502). The source terminals of transistors 711 and 712 are connected to current source 710 (generally, connecting to a current source improves the amplifier's common mode performance, however, the source terminal can be connected to GND also). The gate terminals of transistors 721 and 722 are used as another pair of input terminals (503 and 504). The source terminals of transistors 721 and 722 are connected to current source 730 (again to improve the amplifier's common mode performance, the source terminal can be connected to GND also). The drain terminals of transistors 711 and 721 are connected to each other at node 715. The drain terminals of transistors 712 and 722 are connected to each other at node 725.

As a result, the voltage between nodes 715 and 725 represents the output signal, which is further magnified and provided on paths 591 and 592 by sub-gain circuit 702 as described below.

With respect to connectivity of sub-gain circuit 702, gate terminals of PMOS transistors 741 and 742 are connected to each other and tied to a bias/common mode (not shown). Similarly, the gate terminals of NMOS transistors 751 and 752 are connected to each other and tied to a bias/common mode (common mode). The source terminals of transistors 741 and 742 are respectively connected to nodes 725 and 715. The drain terminals of transistors 741 and 751 are connected to each other (together) by path 591. The drain terminal of transistors 742 and 752 are connected to each other by path 592. Source terminals of transistors 751 and 752 are respectively connected to current sources 770 and 780.

Based on the sizes of transistors 741, 742, 751 and 752, sub-gain circuit 702 amplifies the voltage between nodes 715 and 725, as would be apparent to one skilled in the relevant arts. The amplified output is provided on paths 591 and 592.

In operation, when second pair of input terminals 503 and 504 are connected to ground, voltage across 591-592 represents the differential gain of voltage across first pair of input terminals 501 and 502. Similarly, when first pair of input terminals 501 and 502 are connected to ground, voltage across 591-592 represents the differential gain of voltage across first pair of input terminals 503 and 504.

Thus, operational amplifier 500 provides the desired amplification operation for the two stages. The embodiment(s) of above can be implemented in various devices/systems. The description is continued with respect to an example device in which various aspects of the present invention are implemented.

8. Device

Figure 8:
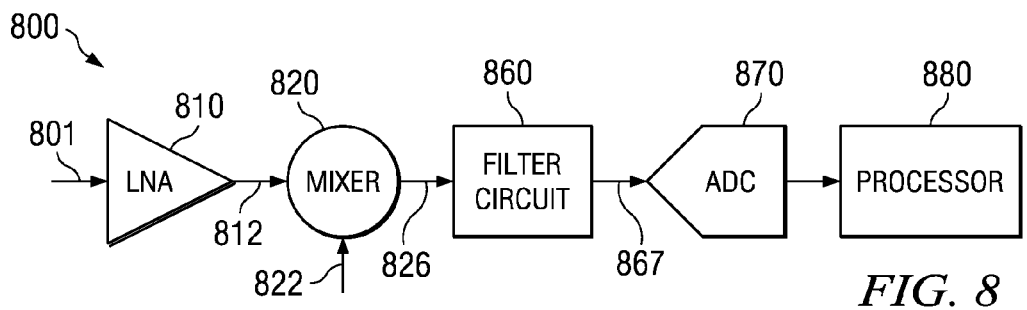
FIG. 8 is a block diagram illustrating the details of implementation of a device in an embodiment of the present invention.

FIG. 8 is a block diagram of receiver system 800 illustrating an example system in which various aspects of the present invention may be implemented. For illustration, it is assumed that receiver system 800 is implemented within a Wireless Receiver. However, receiver system 800 can be implemented in other devices (wireless as well as wire-based communications) as well.

Receiver system 800 is shown containing low noise amplifiers (LNA) 810, mixer 820, filter circuit 860, analog to digital converter (ADC) 870, and processor 880. Each block/stage is described in further detail below.

LNA 810 receives signals on path 801 and amplifies the received signals to generate a corresponding amplified signal on path 812. For example, in wireless systems, the signals that are transmitted from satellites, etc. may be received by an antenna (not shown) and the received signals are provided on path 801. The received signals may be weak in strength and thus amplified by LNA 810 for further processing. LNA 810 may be implemented in a known way.

Mixer 820 may be used to down-convert the received amplified signal on path 812 into an intermediate signal with the frequency band of interest centered at a lower frequency than the carrier frequency of the received signal. In an embodiment, a signal with the frequency band of interest centered at 2.4 GHZ (carrier frequency) is converted to a signal with the frequency band of interest centered at zero frequency.

Mixer 820 may receive the amplified signal on path 812 and a signal of fixed frequency on path 822 as inputs, and provides the intermediate signal on path 826. The signal of fixed frequency on path 822 may be generated by a phase locked loop (not shown) in a known way.

Filter circuit 860 may correspond to a low pass filter, which allows the desired low frequencies and rejects all other unwanted high frequencies present in the signal received on line 826. The filtered signal, which contains the frequency band of interest, is provided on path 867.

ADC 870 converts (samples) the filtered signal received on path 867 to a corresponding digital value, which represents the signal of interest in received signal 801. Processor 880 processes the received digital values to provide various user applications and may be implemented as multiple processing units, each potentially operating independently. ADC 870 may correspond to the ADCs described in sections above (and implemented according to various aspects of the present invention).

9. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. An analog to digital converter (ADC) containing a plurality of stages, wherein each stage samples a corresponding input signal in a sample phase and performs an amplification operation in a hold phase, said ADC comprising:

an operational amplifier having a first pair of input terminals, a second pair of input terminals, and an output terminal, wherein a change of signal strength on any of said first pair of input terminals and said second pair of input terminals in either said sample phase or said hold phase causes a change in the strength of an output signal on said output terminal.

2. The ADC of claim 1, wherein said operational amplifier is shared by a first stage and a second stage for the corresponding amplification operation, said first stage and said second stage being contained is said plurality of stages.

3. The ADC of claim 2, wherein a first input signal corresponding to said first stage is received by said first pair of input terminals, and a second input signal corresponding to said second stage is received by said second pair of input terminals.

4. The ADC of claim 3, wherein said first stage receives said first input signal in a first time duration and said second stage receives said second input signal in a second time duration, wherein said first time duration and said second time duration are non-overlapping.

5. The ADC of claim 4, wherein said first pair of input terminal are coupled to constant bias when said second pair of input terminals receive said second input signal, and said second pair of input terminals are coupled to constant bias when said first pair of input terminals receive said first input signal.

6. The ADC of claim 5, further comprising:
a first capacitor operating as a sampling capacitor for said first stage, one terminal of said first capacitor being connected to one of the terminals of said first pair of input terminals;
a second capacitor operating as a feedback capacitor for said first stage, one terminal of said second capacitor being connected to said one of the terminals of said first pair of input terminals;
a third capacitor operating as a sampling capacitor for said second stage, one terminal of said third capacitor being connected to one of the terminals of said second pair of input terminals;
a fourth capacitor operating as a feedback capacitor for said second stage, one terminal of said fourth capacitor being connected to said one of the terminals of said second pair of input terminals;
a first switch disconnecting the other terminal of said first capacitor from a previous stage in said first duration and connecting said other terminal of said first capacitor to said previous stage in said second duration;
a second switch connecting the other terminal of said second capacitor to said output terminal of said operational amplifier in said first duration and disconnecting said other terminal of said second capacitor to said output terminal of said operational amplifier in said second duration;
a third switch disconnecting said output terminal of said operational amplifier from the other terminal of said third capacitor in said second duration, said third switch connecting said output terminal of said operational amplifier to the other terminal of said third capacitor in said first duration; and
a fourth switch connecting the other terminal of said fourth capacitor to said output terminal of said operational amplifier in said second duration, said fourth switch disconnecting the other terminal of said fourth capacitor from said output terminal of said operational amplifier in said first duration.

7. The ADC of claim 6, further comprising:
a fifth switch connecting said one of the terminals of said first pair to constant bias during said second duration, said fifth switch disconnecting said one of the terminals of said first pair from constant bias during said first duration; and
a sixth switch connecting said one of the terminals of said second pair to constant bias during said first duration, said sixth switch disconnecting said one of the terminals of said second pair from constant bias during said second duration.

8. The ADC of claim 7, wherein the other ones of said first pair of terminals and said second pair of terminals are connected to ground in a single ended operation.

9. The ADC of claim 5, wherein said operational amplifier comprises:
a first current source and a second current source;
a first transistor and a second transistor, the gate terminals of said first transistor and said second transistor providing said first pair of input terminals, the source terminals of said first transistor and said second transistor being coupled to said first current source; and
a third transistor and a fourth transistor, the gate terminal of said third transistor and said fourth transistor providing said second pair of input terminals, the source terminals of said third transistor and said fourth transistor being coupled to said second current source,
the drain terminals of said first transistor and said third transistor being coupled to each other at a first node,
the drain terminals of said second transistor and said fourth transistor being coupled to each other at a second node,
and a first signal formed between said first node and said second node represents said differential output signal.

10. The ADC of claim 9, wherein said first transistor and said second transistor are of P-type, and said third transistor and said fourth transistor are of N-type.

11. The ADC of claim 10, wherein said first current source sources the current and said second current source sinks the current.

12. The ADC of claim 9, wherein said operational amplifier further comprises a sub-gain circuit amplifying said output further, wherein said first transistor, said second transistor said third transistor and said fourth transistor forming an input stage of said operational amplifier.

13. The ADC of claim 12, wherein said sub-gain circuit comprises:
a fifth transistor, a sixth transistor, a seventh transistor and an eighth transistor, the gate terminals said fifth transistor and said sixth transistor being coupled to each other and connected to a bias , the gate terminals of said seventh transistor and said eighth transistor being coupled to each other, and connected to said bias,
said first node being coupled to the source terminal of said fifth transistor,
said second node being coupled to the source terminal of said sixth transistor,
the drain terminals of said fifth transistor and said seventh transistor being coupled to each other at a third node, and
the drain terminals of said sixth transistor and said eighth transistor being coupled to each other at a fourth node,
said third node and said fourth node representing said differential output terminal of said operational amplifier.

14. An operational amplifier having a first pair of input terminals and a second pair of input terminals, said operational amplifier comprising:
a first transistor and a second transistor, the gate terminal of said first transistor and said second transistor providing said first pair of input terminals; and
a third transistor and a fourth transistor, the date terminal of said third transistor and said fourth transistor providing said second pair of input terminals,
the drain terminals of said first transistor and said third transistor being coupled to each other at a first node,
the drain terminals of said second transistor and said fourth transistor being coupled to each other at a second node,
and a first signal formed between said first node and said second node represents an output signal of said operational amplifier,
wherein the source terminals of said first transistor and said second transistor are connected together and coupled to a first fixed bias, the source terminals of said third transistor and said fourth transistor being connected together and being coupled to a second fixed bias,
further comprising a first current source and a second current source,
wherein the source terminals of said first transistor and said second transistor are coupled to said first fixed bias via said first current source, and the source terminals of said third transistor and said fourth transistor are coupled to said second fixed bias via said second current source.

15. A device comprising:

a processor processing a plurality of digital values; and an analog to digital converter (ADC) sampling an analog signal and generating said plurality of digital values, said analog to digital converter (ADC) containing a plurality of stages, wherein each stage samples a corresponding input signal in a sample phase and performs an amplification operation in a hold phase, said ADC comprising an operational amplifier having a first pair of input terminals, a second pair of input terminals, and an output terminal, wherein a change of signal strength on any of said first pair of input terminals and said second pair of input terminals in either said sample phase or said hold phase causes a change in the strength of an output signal on said output terminal.

16. The device of claim 15, wherein said operational amplifier comprises a pair of output terminals to provide output in differential form, said pair of output terminals containing said output terminal.

* * * * *